United States Patent
Que

(10) Patent No.: US 10,012,881 B2
(45) Date of Patent: Jul. 3, 2018

(54) REPAIRING METHODS OF DEFECTIVE PIXELS HAVING LIGHT SPOTS, ARRAY SUBSTRATES AND LIQUID CRYSTAL PANELS

(71) Applicant: Shenzhen China Star Optoelectronics Technology Co., Ltd., Shenzhen, Guangdong (CN)

(72) Inventor: Xiangdeng Que, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 319 days.

(21) Appl. No.: 14/894,586

(22) PCT Filed: Nov. 12, 2015

(86) PCT No.: PCT/CN2015/094464
§ 371 (c)(1),
(2) Date: Nov. 30, 2015

(87) PCT Pub. No.: WO2017/079943
PCT Pub. Date: May 18, 2017

(65) Prior Publication Data
US 2017/0192325 A1 Jul. 6, 2017

(30) Foreign Application Priority Data
Nov. 10, 2015 (CN) .......................... 2015 1 0760127

(51) Int. Cl.
*G02F 1/1362* (2006.01)
*G02F 1/13* (2006.01)
*G09G 3/00* (2006.01)

(52) U.S. Cl.
CPC ...... *G02F 1/136259* (2013.01); *G02F 1/1309* (2013.01); *G09G 3/006* (2013.01); *G02F 2001/136263* (2013.01); *G02F 2001/136268* (2013.01)

(58) Field of Classification Search
None
See application file for complete search history.

(56) References Cited

U.S. PATENT DOCUMENTS

| 5,260,818 A * | 11/1993 | Wu ..................... G02F 1/13624 349/144 |
| 2004/0125300 A1* | 7/2004 | Lee ................... G02F 1/134363 349/141 |
| 2014/0014962 A1* | 1/2014 | Arai .................... H01L 33/0041 257/59 |

* cited by examiner

*Primary Examiner* — Edward Glick
*Assistant Examiner* — Anthony G Quash
(74) *Attorney, Agent, or Firm* — Andrew C. Cheng

(57) ABSTRACT

A repairing method of defective pixels having light spots includes: connecting the pixel electrode and a drain electrode of the of the TFT via a point welding method; cutting off the continuous common electrode to divide the common electrode within the switch area and the common electrode within the pixel area; and removing the pixel electrode arranged above intersections of the common electrode, and connecting the pixel electrode within the switch area and the pixel electrode within pixel area. In addition, an array substrate and a liquid crystal panel are disclosed. By cutting off the common electrode within the pixel area switch area and the pixel area, the defective pixels having light spots are eliminated. In addition, such defective pixels are repaired to be pixels capable of emitting light normally.

6 Claims, 2 Drawing Sheets

FIG. 1

REPAIRING METHODS OF DEFECTIVE PIXELS HAVING LIGHT SPOTS, ARRAY SUBSTRATES AND LIQUID CRYSTAL PANELS

BACKGROUND OF THE INVENTION

1. Field of the Invention

The present disclosure relates to liquid crystal display technology, and more particularly to a repairing method of defective pixels having light spots, an array substrate, and a liquid crystal panel.

2. Discussion of the Related Art

Light spots on the liquid crystal panel usually are caused by the defective manufacturing process of the thin film transistor (TFT). Such defective manufacturing process results in that the color of some of the pixels, or pixel cells, remains the same during the displaying process of the liquid crystal panel, and such issue cannot be easily resolved.

Generally, only one light spot may degrade the quality of the liquid crystal panel, and the liquid crystal panel may be scrapped when there are at least twenty bright spots. The conventional technical solution is to convert the light spot into dark spot. During the normal displaying process, the effect of the dark spot on the liquid crystal panel is more acceptable than that of the light spot. Nevertheless, dark spot is still one issue, and how to convert the dark spot into a normal spot is still the issue to be overcome.

SUMMARY

In order to overcome the above problems, a method for repairing light spots into normal spots, an array substrate adopting the repairing method, and the liquid crystal panel having the array substrate are disclosed.

In one aspect, a repairing method of defective pixels having light spots, pixels are arranged within a switch area and a pixel area arranged at one side of the switch area, the pixel includes: forming a continuous common electrode within the switch area and the pixel area; forming a thin film transistor (TFT) on the common electrode within the switch area; forming a passivation layer within the pixel area and the switch area, the passivation layer covers the TFT, and forming a through hole on the passivation layer within the switch area; forming at least one pixel electrode on the passivation layer within the pixel area and within the switch area; wherein the repairing method includes: connecting the pixel electrode and a drain electrode of the of the TFT via a point welding method; cutting off the continuous common electrode to divide the common electrode within the switch area and the common electrode within the pixel area; and removing the pixel electrode arranged above intersections of the common electrode, and connecting the pixel electrode within the switch area and the pixel electrode within pixel area.

Wherein the step of connecting the pixel electrode and a drain electrode of the of the TFT via a point welding method further includes: adopting laser to conduct the point welding method within the through hole to connect the pixel electrode and the drain electrode of the TFT.

Wherein the common electrode includes a main portion within the switch area and extended portions extending from the main portion toward the pixel area, and the extended portions are parallel to each other; and wherein the step of cutting off the continuous common electrode further includes: cutting off the intersections of the main portion and each of the extended portion of the common electrode by laser such that the main portion and the main portion and each of the extended portions are independent from each other, and the extended portions are independent from each other.

Wherein the common electrode includes a main portion within the switch area and extended portions extending from the main portion toward the pixel area, and the extended portions are parallel to each other; and wherein the step of cutting off the continuous common electrode further includes: cutting off the intersections of the main portion and each of the extended portion of the common electrode by laser such that the main portion and the main portion and each of the extended portions are independent from each other, and the extended portions are independent from each other.

Wherein the step of removing the pixel electrode arranged above intersections of the common electrode further includes: removing the pixel electrode above the intersections of the main portion and the extended portions.

In another aspect, an array substrate, includes: a plurality of pixels arranged in a matrix, the pixels are arranged within a switch area and a pixel area at one lateral side of the switch area, when the pixel on the array substrate includes a bright spot, the pixel includes: a continuous common electrode is formed within the switch area and the pixel area; a TFT on the common electrode within the switch area; a passivation layer covering the TFT is formed within the switch area and the pixel area, and a through hole is formed on the passivation layer within the switch area; at least one pixel electrode on the passivation layer within the pixel area and within the switch area; wherein a repairing method of defective pixels having light spots on the array substrate includes: connecting the pixel electrode and a drain electrode of the of the TFT via a point welding method; cutting off the continuous common electrode to divide the common electrode within the switch area and the common electrode within the pixel area; and removing the pixel electrode arranged above intersections of the common electrode, and connecting the pixel electrode within the switch area and the pixel electrode within pixel area.

Wherein the step of connecting the pixel electrode and a drain electrode of the of the TFT via a point welding method further includes: adopting laser to conduct the point welding method within the through hole to connect the pixel electrode and the drain electrode of the TFT.

Wherein the common electrode includes a main portion within the switch area and extended portions extending from the main portion toward the pixel area, and the extended portions are parallel to each other; and wherein the step of cutting off the continuous common electrode further includes: cutting off the intersections of the main portion and each of the extended portion of the common electrode by laser such that the main portion and the main portion and each of the extended portions are independent from each other, and the extended portions are independent from each other.

Wherein the common electrode includes a main portion within the switch area and extended portions extending from the main portion toward the pixel area, and the extended portions are parallel to each other; and wherein the step of cutting off the continuous common electrode further includes: cutting off the intersections of the main portion and each of the extended portion of the common electrode by laser such that the main portion and the main portion and each of the extended portions are independent from each other, and the extended portions are independent from each other.

Wherein the extended portions are parallel to each other.

Wherein the step of removing the pixel electrode arranged above intersections of the common electrode further includes: removing the pixel electrode above the intersections of the main portion and the extended portions.

In another aspect, a liquid crystal panel, includes: a color filter (CF) substrate and an array substrate having a plurality of pixels arranged in a matrix, the pixels are arranged within a switch area and a pixel area at one lateral side of the switch area, when the pixel on the array substrate includes a bright spot, the pixel includes: a continuous common electrode is formed within the switch area and the pixel area; a TFT on the common electrode within the switch area; a passivation layer covering the TFT is formed within the switch area and the pixel area, and a through hole is formed on the passivation layer within the switch area; at least one pixel electrode on the passivation layer within the pixel area; wherein a repairing method of defective pixels having light spots on the array substrate includes: connecting the pixel electrode and a drain electrode of the of the TFT via a point welding method; cutting off the continuous common electrode to divide the common electrode within the switch area and the common electrode within the pixel area; and removing the pixel electrode arranged above intersections of the common electrode, and connecting the pixel electrode within the switch area and the pixel electrode within pixel area.

In view of the above, by cutting off the main portion of the common electrode within the switch area and each of the main portions of the common electrode within the pixel area, the storage capacitor of the defective pixels having the light spot is damaged, and the pixels s formed as the pixel without the storage capacitor. As such, the light spot issue of the pixels is resolved. At the same time, the drain electrode of the pixels also electrically contacts with the pixel electrode, and thus the pixels without the storage capacitor can still emit light. In this way, the defective pixels are repaired.

BRIEF DESCRIPTION OF THE DRAWINGS

FIG. 1 is a planar view of the thin film transistor (TFT) array substrate in accordance with one embodiment.

DETAILED DESCRIPTION OF THE EMBODIMENTS

Figure 2:
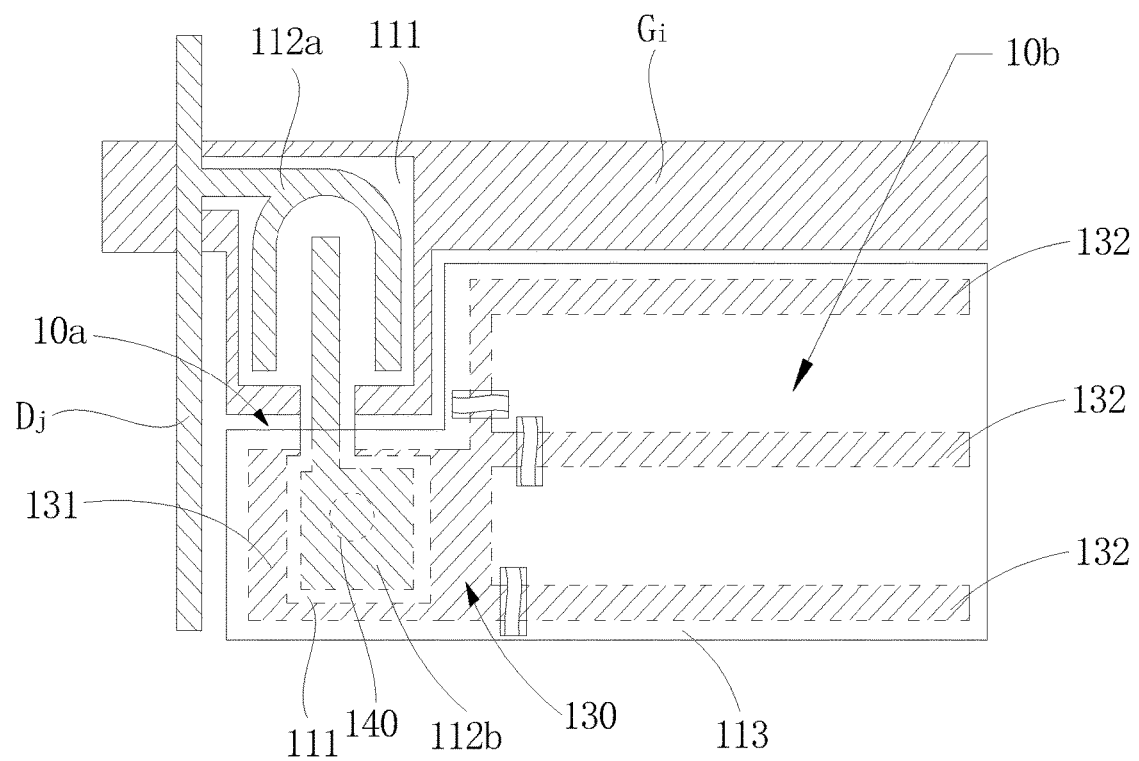
FIG. 2 is a planar view of the structure of the pixel in accordance with one embodiment.

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

Figure 1:
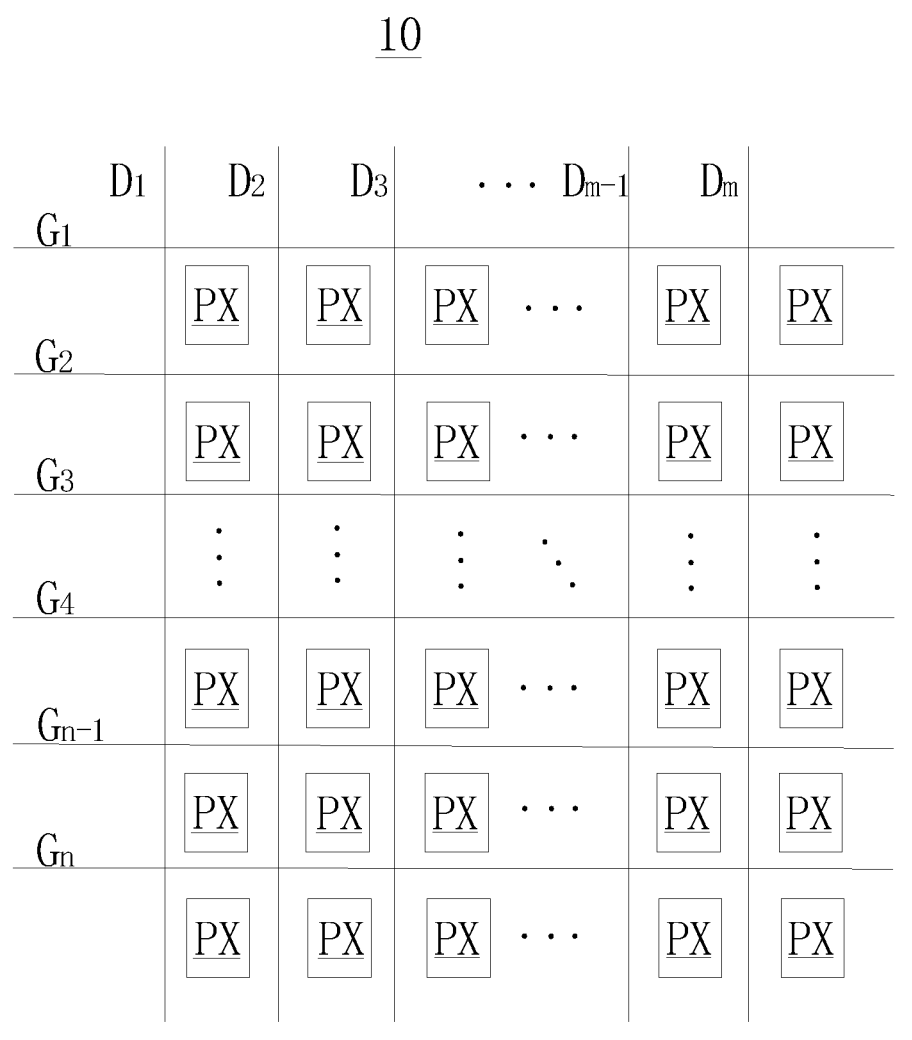

FIG. 1 is a planar view of the thin film transistor (TFT) array substrate in accordance with one embodiment. The TFT array substrate 10 includes a plurality of gate lines ($G_1$ through $G_n$) transmitting gate signals, a plurality of data lines ($D_1$ through $D_m$) transmitting data signals, and a plurality of pixels (PX) arranged in a matrix. The gate lines ($G_1$ through $G_n$) are arranged along a row direction, and the gate lines ($G_1$ through $G_n$) are substantially parallel to each other. The data lines ($D_1$ through $D_m$) are arranged along a column direction and are substantially parallel to each other. Each of the pixels (PX) include a TFT connecting to a corresponding gate line and a corresponding data line, a liquid crystal capacitor connecting to the TFT, and a storage capacitor connecting with the liquid crystal capacitor in parallel.

The structure of the pixels (PX) will be described in accordance with the embodiments hereinafter. FIG. 2 is a planar view of the structure of the pixel in accordance with one embodiment.

Referring to FIG. 2, the pixels (PX) may be arranged within the switch area 10a and the pixel area 10b at a lateral side of the switch area 10a. Specifically, in the embodiment, the pixel area 10b is arranged at a right side of the switch area 10a, but the present disclosure is not limited to the above configuration. For instance, the pixel area 10b may be arranged at a left side of the switch area 10a.

The manufacturing process of the pixels (PX) will be described hereinafter.

First, a first metallic layer is formed within the switch area 10a and the pixel area 10b. In addition, the first metallic layer is exposed and developed to form a gate electrode 110 within the switch area 10a. At the same time, a continuous and integrally formed common electrode 130 is formed within the switch area 10a and the pixel area 10b. The common electrode 130 operates as a bottom electrode of the storage capacitor.

Further, the common electrode 130 includes a main portion 131 within the switch area 10a and three extended portions 132 extending from the main portion 131 toward the pixel area 10b, and the three extended portions 132 are parallel to each other. It can be understood that the number of the extended portions 132 is not limited to three, and may be configured in accordance with real scenario.

In addition, the first metallic layer may be made by Ta, MoTa, MoW, or Al. It is to be noted that the gate line $G_i$ ($1 \leq i \leq n$), the gate electrode 110 and the common electrode 130 are formed at the same time, and the gate electrode 110 connects to the gate line G Afterward, a gate insulation layer (not shown) is formed to cover the gate electrode 110, the common electrode 130, and the gate line $G_i$. That is, the gate insulation layer is formed within the pixel area 10b and the switch area 10a. The gate insulation layer may be made by SiNx and/or SiOx, but the present disclosure is not limited thereto.

An active layer 111 is formed within the switch area 10a. The active layer 111 may be made by, but not limited to, a-Si.

A second metallic layer is formed on the active layer 111, and the second metallic layer is exposed and developed to form a source electrode 112a and a drain electrode 112b on the active layer 111. The source electrode 112a and the drain electrode 112b are independent from each other. The drain electrode 112b operates as a top electrode of the storage capacitor. The second metallic layer may be made by Ta, MoTa, MoW, or Al. It is to be noted that the data line $D_j$ ($1 \leq j \leq m$), the source electrode 112a, and the drain electrode 112b are formed at the same time. In addition, the source electrode 112a connects to the data line $D_j$.

A passivation layer (not shown) is formed on the gate insulation layer to cover the active layer 111, the source electrode 112a, and the drain electrode 112b. That is, the passivation layer is formed within the pixel area 10b and the switch area 10a.

A through hole 140 is formed on the passivation layer within the switch area 10a. The through hole 140 expose the drain electrode 112b.

A pixel electrode 113 is formed on the passivation layer within the pixel area 10b. The pixel electrode 113 extends into the passivation layer within the switch area 10a and then connects to the drain electrode 112b via the through hole 140.

The pixels (PX) may be normal light-emitting pixels if the above manufacturing process are conducted normally. Nevertheless, in real scenario, during the manufacturing process of the pixel electrode 113, the pixel electrode 113 and the drain electrode 112b may not be connected. As such, the pixels (PX) may be abnormal pixels, and the light spot issue may happen.

When the pixels (PX) include light spot, the repairing process for repairing the pixels (PX) having light spot to normal light-emitting pixels (PX) will be described hereinafter.

Referring to FIG. 2, the repairing method will include the following steps.

At first, the pixel electrode 113 and the drain electrode 112b are welded together via a point welding method within the through hole 140 formed on the passivation layer within the switch area 10a. For instance, the pixel electrode 113 and the drain electrode 112b may be welded together via a laser melting way within the original through hole 140.

Afterward, the continuous and integrally formed common electrode 130 is cut off. In FIG. 2, thee hyperbola at the intersections of the main portion 131 and each of the extended portion 132 of the common electrode 130 is directed to the cutting point. In the embodiment, the intersections of the main portion 131 and each of the extended portion 132 of the common electrode 130 may be cut off by adopting the laser cutting method so as to split the continuous and integrally formed common electrode 130. It can be understood that other cutting method may be adopted, for instance, the common electrode 130 may be cut by adopting micro-cutting method. The common electrode 130 is divided along the intersections of the main portion 131 and each of the extended portion 132 of the common electrode 130. In this way, the main portion 131 and each of the extended portions 132 are independent from each other, and also the extended portions 132 are independent from each other.

Afterward, the pixel electrodes 113 arranged above the intersections of the common electrode 130 are removed. At the same time, the remaining pixel electrode 113 is electrically connected with the drain electrode 112b. In this way, the pixel electrode 113 is prevented from being connected with the common electrode 130. Specifically, the pixel electrode 113 arranged above the intersections of the main portion 131 and each of the extended portion 132 of the common electrode 130 are removed. In FIG. 2, the rectangular frame above the intersections of the main portion 131 and each of the extended portion 132 of the common electrode 130 mean that the pixel electrode 113 arranged thereon is removed.

In this way, by cutting off the main portion 131 of the common electrode 130 within the switch area 10a and each of the main portions 131 of the common electrode 130 within the pixel area 10b, the storage capacitor of the defective pixels (PX) having the light spot is damaged, and the pixels (PX) is formed as the pixel without the storage capacitor. As such, the light spot issue of the pixels (PX) is resolved. At the same time, the drain electrode 112b of the pixels (PX) also electrically contacts with the pixel electrode 113, and thus the pixels (PX) without the storage capacitor can still emit light. In this way, the defective pixels (PX) are repaired.

Figure 3:
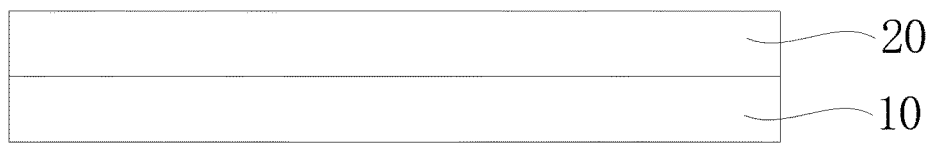
FIG. 3 is a schematic view of the liquid crystal panel in accordance with one embodiment.

In one embodiment, the TFT array substrate 10 and a color filter (CF) substrate are arranged opposite to each other to form the liquid crystal panel. FIG. 3 is a schematic view of the liquid crystal panel in accordance with one embodiment.

Referring to FIG. 3, the liquid crystal panel includes the TFT array substrate 10 and the CF substrate 20 opposite to the TFT array substrate 10.

In the embodiment, the CF substrate 20 usually includes components such as black matrix and alignment films, but colorful RGB photoresist is not included therein. In addition, the structure of the CF substrate 20 may be similar to the conventional CF substrate, and thus is omitted hereinafter.

In addition, in the embodiment, the colorful RGB photoresist is formed on the TFT array substrate 10. Such technical solution may also be referred to conventional configuration.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A repairing method of defective pixels having light spots, pixels are arranged within a switch area and a pixel area arranged at one side of the switch area, the pixel comprises:

forming a continuous common electrode within the switch area and the pixel area, wherein the common electrode comprises a main portion within the switch area and extended portions extending from the main portion toward the pixel area;

forming a thin film transistor (TFT) on the common electrode within the switch area;

forming a passivation layer within the pixel area and the switch area, the passivation layer covers the TFT, and forming a through hole on the passivation layer within the switch area;

forming at least one pixel electrode on the passivation layer within the pixel area and within the switch area;

wherein the repairing method comprising;

connecting the pixel electrode and a drain electrode of the of the TFT via a point welding method;

cutting off the continuous common electrode at intersections of the main portion and each of the extended portion to divide the common electrode within the switch area and the common electrode within the pixel area; and removing the pixel electrode arranged above the intersections of the common electrode, and connecting the pixel electrode within the switch area and the pixel electrode within pixel area.

2. The repairing method as claimed in claim 1, wherein the step of connecting the pixel electrode and a drain electrode of the of the TFT via a point welding method further comprises:

adopting laser to conduct the point welding method within the through hole to connect the pixel electrode and the drain electrode of the TFT.

3. The repairing method as claimed in claim 2, wherein the extended portions are parallel to each other; and wherein the step of cutting off the continuous common electrode further comprises:

cutting off the intersections of the main portion and each of the extended portion of the common electrode by laser such that the main portion and each of the extended portions are independent from each other, and the extended portions are independent from each other.

4. The repairing method as claimed in claim 3, wherein the step of removing the pixel electrode arranged above intersections of the common electrode further comprises:

removing the pixel electrode above the intersections of the main portion an the extended portions.

5. The repairing method as claimed in claim 1, wherein the extended portions are parallel to each other; and wherein the step of cutting off the continuous common electrode further comprises:

cutting off the intersections of the main portion and each of the extended portion of the common electrode by laser such that the main portion and each of the extended portions are independent from each other, and the extended portions are independent from each other.

6. The repairing method as claimed in claim 5, wherein the step of removing the pixel electrode arranged above intersections of the common electrode further comprises:

removing the pixel electrode above the intersections of the main portion and the extended portions.

* * * * *